(12) United States Patent
Imayoshi

(10) Patent No.: US 10,790,209 B2
(45) Date of Patent: Sep. 29, 2020

(54) WIRING CIRCUIT SUBSTRATE, SEMICONDUCTOR DEVICE, METHOD OF PRODUCING THE WIRING CIRCUIT SUBSTRATE, AND METHOD OF PRODUCING THE SEMICONDUCTOR DEVICE

(71) Applicant: TOPPAN PRINTING CO., LTD., Tokyo (JP)

(72) Inventor: Koji Imayoshi, Tokyo (JP)

(73) Assignee: TOPPAN PRINTING CO., LTD., Tokyo (JP)

(*) Notice: Subject to any disclaimer, the term of this patent is extended or adjusted under 35 U.S.C. 154(b) by 135 days.

(21) Appl. No.: 15/835,637

(22) Filed: Dec. 8, 2017

(65) Prior Publication Data

US 2018/0166354 A1  Jun. 14, 2018

Related U.S. Application Data

(63) Continuation of application No. PCT/JP2016/002736, filed on Jun. 7, 2016.

(30) Foreign Application Priority Data

Jun. 12, 2015  (JP) .................. 2015-119668

(51) Int. Cl.
*B32B 3/00* (2006.01)
*H01L 23/15* (2006.01)
(Continued)

(52) U.S. Cl.
CPC ............ *H01L 23/15* (2013.01); *H01L 21/486* (2013.01); *H01L 23/49827* (2013.01);
(Continued)

(58) Field of Classification Search
None
See application file for complete search history.

(56) References Cited

U.S. PATENT DOCUMENTS

| 7,417,867 B1 | 8/2008 | Matsuda et al. |
| 2005/0170640 A1* | 8/2005 | Nakagawa ........ H01L 21/31058 |
| | | 438/631 |

(Continued)

FOREIGN PATENT DOCUMENTS

| CN | 1290121 A | 4/2001 |
| CN | 101362308 A | 2/2009 |

(Continued)

OTHER PUBLICATIONS

International Search Report issued in International Patent Application No. PCT/JP2016/002736 dated Aug. 9, 2016.
(Continued)

*Primary Examiner* — Seth Dumbris
(74) *Attorney, Agent, or Firm* — Foley & Lardner LLP

(57) ABSTRACT

A wiring circuit substrate includes a glass base, insulating resin layers, wire groups, a first inorganic adhesive layer, a through electrode, and second conductive layers. The glass base has a through-hole. The insulating resin layers are laminated to the glass base and each have a conductive via formed therein. The wire groups are laminated to the insulating resin layers. The first inorganic adhesive layer is laminated to the inner surface of the through-hole. The through electrode is formed of a first conductive layer laminated to the first inorganic adhesive layer. The second conductive layers are formed on the through electrode and the glass base and electrically connected to the upper and lower ends of the through electrode. The glass base has a surface roughness Ra of 100 nm or less, and the second
(Continued)

conductive layers each have an amount of dishing of 5 μm or less above the through electrode.

14 Claims, 7 Drawing Sheets

(51) Int. Cl.
    *H01L 23/498*    (2006.01)
    *H05K 3/46*      (2006.01)
    *H05K 3/40*      (2006.01)
    *H01L 21/48*     (2006.01)
    *H05K 1/11*      (2006.01)
    *H05K 1/03*      (2006.01)
    *H05K 1/09*      (2006.01)
    *H05K 3/42*      (2006.01)

(52) U.S. Cl.
    CPC .......... *H05K 1/0306* (2013.01); *H05K 1/092* (2013.01); *H05K 1/11* (2013.01); *H05K 3/4069* (2013.01); *H05K 3/46* (2013.01); *H05K 3/4605* (2013.01); *H01L 21/4857* (2013.01); *H01L 23/49816* (2013.01); *H01L 23/49822* (2013.01); *H05K 3/429* (2013.01); *H05K 2201/0959* (2013.01); *Y10T 428/24917* (2015.01)

(56) References Cited

U.S. PATENT DOCUMENTS

| | | | |
|---|---|---|---|
| 2009/0042392 | A1 | 2/2009 | Tokura et al. |
| 2012/0075216 | A1 | 3/2012 | Black et al. |
| 2013/0119555 | A1* | 5/2013 | Sundaram ............. H01L 21/486 257/774 |
| 2013/0228918 | A1* | 9/2013 | Chen ................. H01L 23/49811 257/737 |

FOREIGN PATENT DOCUMENTS

| | | |
|---|---|---|
| CN | 103119703 A | 5/2013 |
| JP | 2000-246474 | 9/2000 |
| JP | 2000-302488 | 10/2000 |
| JP | 2001-102479 | 4/2001 |
| JP | 2002-261204 | 9/2002 |
| JP | 2008-205356 | 9/2008 |
| JP | 2013-521663 | 6/2013 |
| JP | 2013-222944 | 10/2013 |
| JP | 2015-070189 | 4/2015 |

OTHER PUBLICATIONS

Office Action dated Jul. 3, 2020 received in corresponding Chinese application No. 201680034249.1 (12) pages and English translation (10 pages).

* cited by examiner

100

200

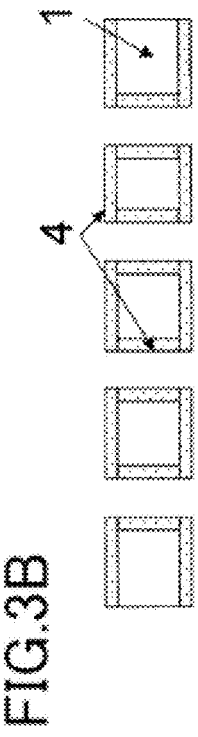
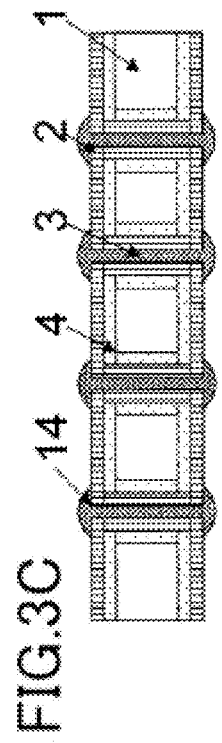
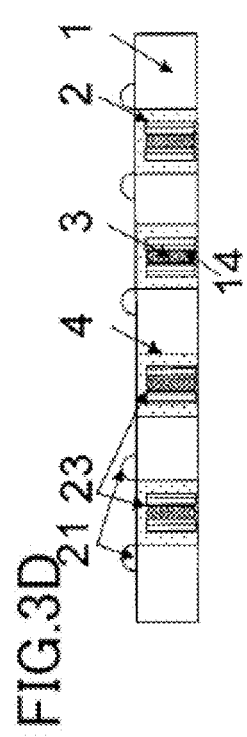
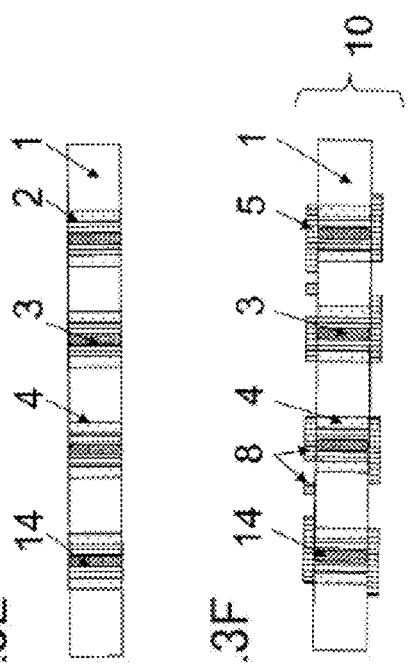
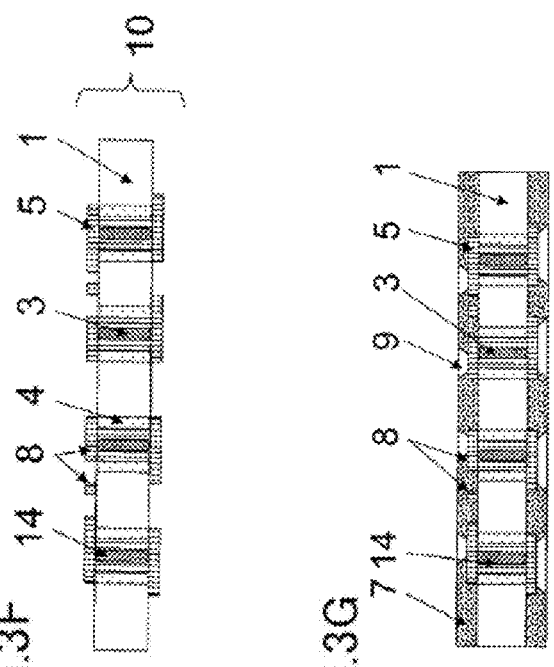
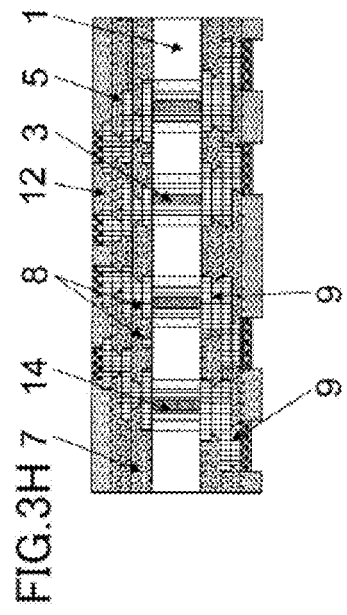

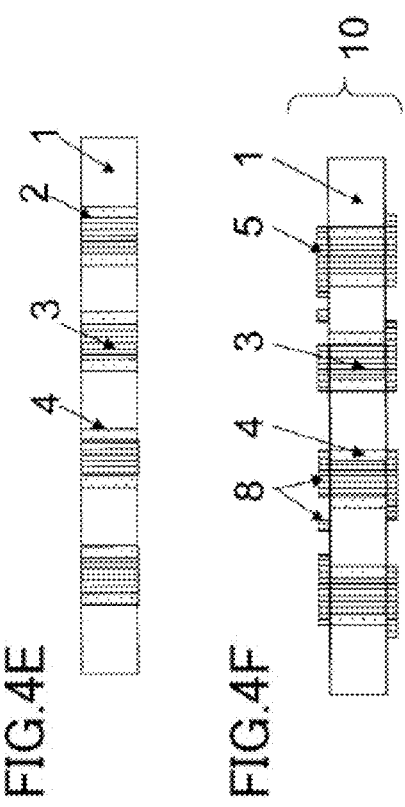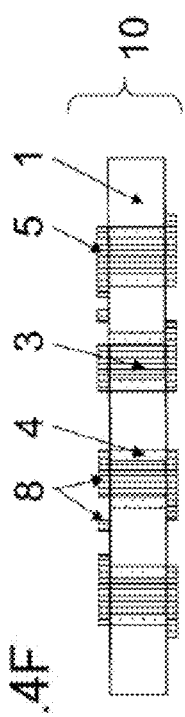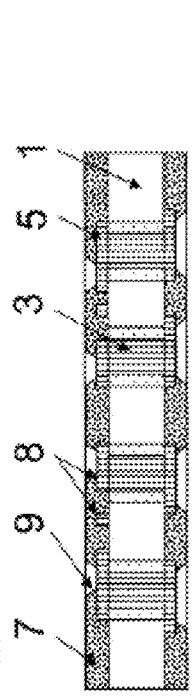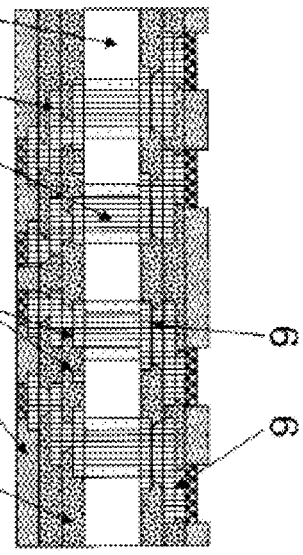
FIG.4E  FIG.4F  FIG.4G  FIG.4H
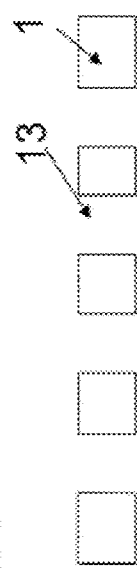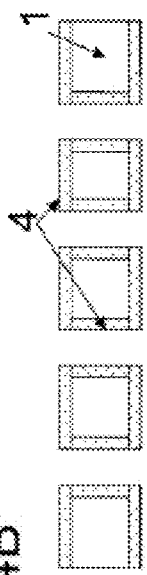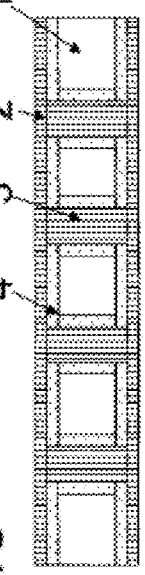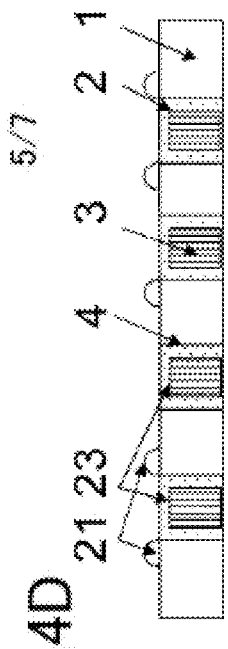
FIG.4A  FIG.4B  FIG.4C  FIG.4D

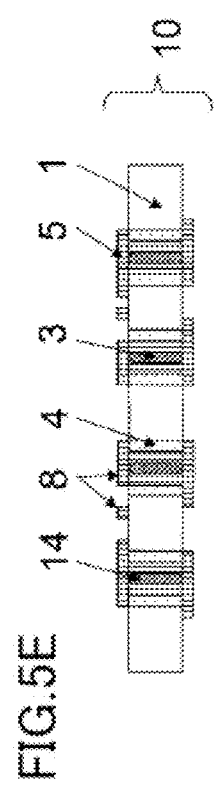
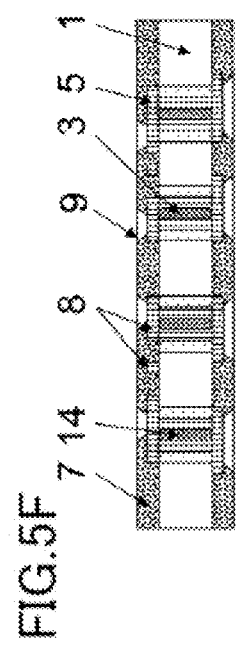
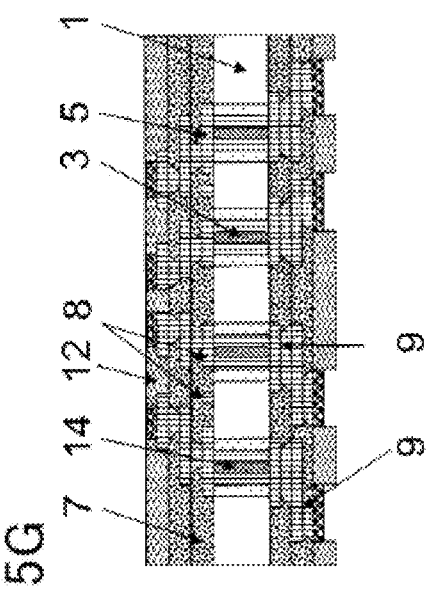
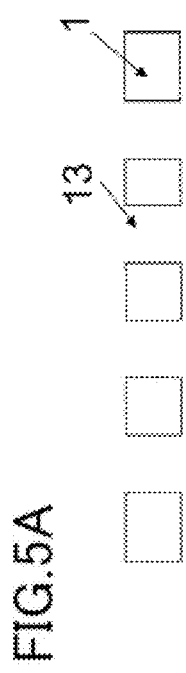
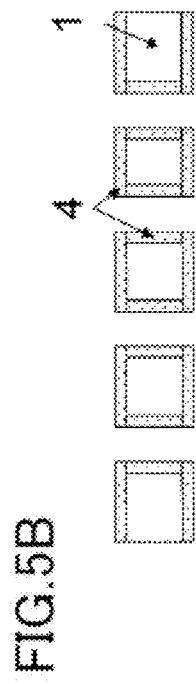
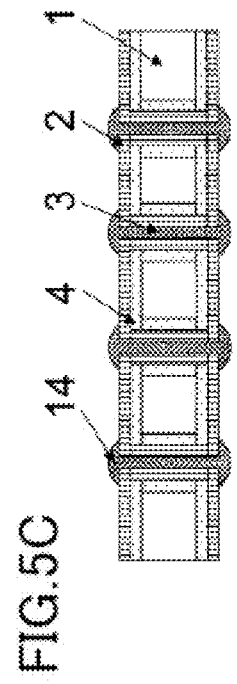
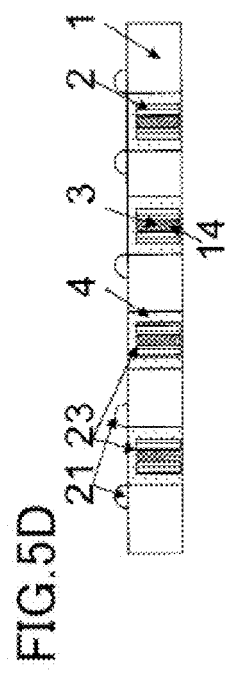

FIG.6
(Prior Art)
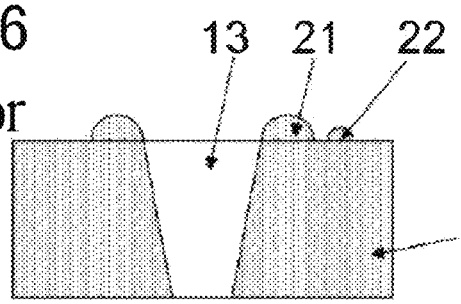
CROSS-SECTIONAL DIAGRAM
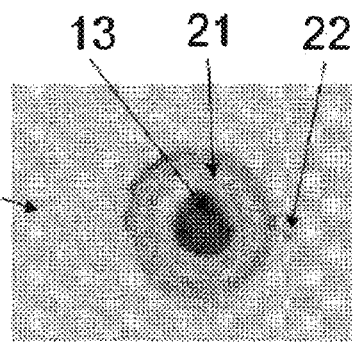
PHOTOGRAPH OF FRONT SURFACE

CROSS-SECTIONAL DIAGRAM

PHOTOGRAPH OF FRONT SURFACE

WIRING CIRCUIT SUBSTRATE, SEMICONDUCTOR DEVICE, METHOD OF PRODUCING THE WIRING CIRCUIT SUBSTRATE, AND METHOD OF PRODUCING THE SEMICONDUCTOR DEVICE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Application No. PCT/JP2016/002736, filed on Jun. 7, 2016, which is based upon and claims the benefit of priority of Japanese Patent Application No. 2015-119668, filed on Jun. 12, 2015, the entireties of which are hereby incorporated by reference.

TECHNICAL FIELD

The present invention relates to a wiring circuit substrate (interposer) and a semiconductor device. In particular, the present invention relates to a wiring circuit substrate interposed between a package substrate and a semiconductor element, and to a semiconductor device having a wiring circuit substrate for connecting semiconductor elements.

BACKGROUND ART

Package substrates are conventionally used to connect a fine-pitch semiconductor element to an external substrate, such as a daughter board.

The package substrate is formed from a ceramic or a resin.

A ceramic package substrate has a calcined metallized material formed thereon and thus has a high resistance. A substrate of this kind is also formed from a ceramic having a high dielectric constant. These characteristics make it unsuitable for such a substrate to have a high-frequency, high-performance semiconductor element mounted thereto.

A resin package substrate has plated copper wires formed thereon and thus has a low wire resistance. A substrate of this kind is also formed from a resin having a low dielectric constant. These characteristics make it more suitable for such a substrate to have a high-frequency, high-performance semiconductor element mounted thereto.

A technique to interpose an interposer (wiring circuit substrate) between a package substrate and a semiconductor element is disclosed, for example, in Patent Documents 1 to 4.

In recent years, research has been actively pursued on interposers having a silicon or glass substrate for use in high-end applications, and they are attracting much attention.

An interposer having a silicon or glass base is particularly characterized by using a technique called TSV (Through-Silicon Via) or TGV (Through-Glass Via), which involves forming a through-hole in the base and filling the through-hole with a conductive material. A through electrode formed with this technique connects the front and back of the base with the shortest distance therebetween and thus has a shorter wire length. Such a through electrode is expected to have superior electrical properties such as a faster propagation speed of signals.

Because the through electrode has a coefficient of linear expansion equal or close to that of a semiconductor element, the dimensional change of the base during heating is small, which may enable the high-density mounting and high-density wiring. Further, multi-pin parallel connection becomes possible with the adoption of a through electrode. This eliminates the need for a faster LSI while providing superior electrical properties, and therefore low power consumption is expected.

Particularly in recent years, a glass interposer having a glass substrate is attracting much attention. One of the reasons for the large interest in glass interposer is the achievement of cost reduction. This reflects the fact that a silicon interposer can only be produced in a size of a wafer while it is considered that a glass interposer can be mass-produced in a large panel size, which may resolve the cost issues that have been a major problem with interposers for high-end applications.

CITATION LIST

Patent Literature

Patent Document 1: JP 2001-102479 A
Patent Document 2: JP 2002-261204 A
Patent Document 3: JP 2000-302488 A
Patent Document 4: JP 2000-246474 A

SUMMARY OF THE INVENTION

Technical Problem

However, many problems need to be solved in designing a glass interposer.

Examples of a method of forming a through-hole in a glass substrate include drilling or blasting, etching with a reactive gas or hydrofluoric acid, and laser beam machining. However, since a glass substrate is formed from an amorphous material, which has low elasticity and is thus prone to cracking when tensile stress is applied thereto, microcracks form or the glass substrate itself cracks, for example, when physical processing such as drilling or blasting is applied.

Further, etching with a fluorine-based reactive gas involves low decomposition rate and a long processing time, while etching with hydrofluoric acid cannot be used to form a through-hole of small diameter because in this process the reaction proceeds isotropically.

Among the methods mentioned above, processing with a UV laser beam, CO2 laser beam, or short pulse laser can be used to form a through-hole of small diameter at high speed. However, there is a trade-off between a processing speed and circularity of a hole. With increases in the processing speed, a scattered nodule generated from a molten glass material forms on the surface of a glass substrate, or bank-like dross forms around a through-hole, resulting in a reduced smoothness of the surface of the glass substrate. Due to the asperities of the glass substrate, it may be difficult to form fine wires on the surface of the glass substrate, or stress on wires may be concentrated at the asperities, leading to wire breakage.

Further, after a conductive material is formed on the glass surface by plating, a conductive layer thus formed can be removed using CMP (Chemical Mechanical Polishing) because this layer is thick. In this process, however, a weak amorphous portion of the glass surface is polished with a polishing solution of CMP, resulting in microscopic asperities formed on the glass surface and thus reducing the smoothness of the glass surface. In this case, again, due to the asperities of the glass substrate, it may be difficult to form fine wires on the surface of the glass substrate, or stress on wires may be concentrated at the asperities, leading to wire breakage.

For example, as shown in FIG. 6, when a through-hole 13 is formed in a glass base 1 by irradiating it with a UV laser, CO2 laser, or the like from above, bank-like dross 21 and a nodule 22 generated from molten glass form on the glass surface. The height of the dross 21 and the nodule 22 from the glass surface is about 10 μm.

As shown in FIG. 7, when the conductive layer on the glass surface is removed with CMP after a material for a conductive layer is formed on the glass surface by plating, a weak amorphous portion and a metal component portion of the glass surface are polished with an acid polishing solution of CMP having solubility of the conductive layer, resulting in minute depressions 24 formed in the glass surface. The depth of the depressions 24 from the glass surface is 3 μm or less.

When the conductive layer on the glass surface is removed with CMP, a conductive layer and a hole-filling resin 14 formed in the through-hole 13 are polished and removed deeper than the glass surface, due to a physical polishing component containing a filler besides a chemical polishing component in the polishing solution, thus resulting in dishing 23. The depth of the dishing 23 from the glass surface is about 10 μm, and therefore dishing of about 5 μm is left even if a conductive layer is formed on the dishing 23.

To solve such problems, it is an object of the present invention to provide a wiring circuit substrate that has wires formed on each surface of a glass base and that has sufficient reliability by smoothing the surfaces of the glass base having a through-hole, semiconductor device, a method of producing the wiring circuit substrate, and a method of producing the semiconductor device.

Solution to Problem

To solve the above problems, one aspect of the present invention is a wiring circuit substrate including a glass base, insulating resin layers, wire groups, a first inorganic adhesive layer, a through electrode, and second conductive layers. The wiring circuit substrate has a through-hole. The insulating resin layers are laminated to the glass base and each have a conductive via formed therein. The wire groups are laminated to the insulating resin layers. The first inorganic adhesive layer is laminated to the inner surface of the through-hole. The through electrode is formed of a first conductive layer laminated to the first inorganic adhesive layer. The second conductive layers are formed on the through electrode and the glass base, and electrically connected to the upper and lower ends of the through electrode. The glass base has a surface roughness Ra of 100 nm or less, and the second conductive layers each have an amount of dishing of 5 μm or less over the through electrode.

The inside of the first conductive layer may be filled with a hole-filling resin, and the upper and lower ends of the through electrode may be covered with the second conductive layers.

The inside of the first inorganic adhesive layer may be filled with the first conductive layer.

Second inorganic adhesive layers may be formed on the glass base and the through electrode, and the second conductive layers may be formed on the second inorganic adhesive layers and may form wire groups.

The wire groups may each be covered with an insulating resin layer having a thermal expansion coefficient greater than that of a material of the second conductive layer.

The first or second inorganic adhesive layer may be a single-layer or laminated film containing one of tin oxide, indium oxide, zinc oxide, nickel, nickel phosphorus, chromium, chromium oxide, aluminum nitride, copper nitride, aluminum oxide, tantalum, titanium, and copper.

A conductive material forming the first or second conductive layer and the through electrode may contain one of copper, silver, gold, nickel, platinum, palladium, ruthenium, tin, tin silver, tin silver copper, tin copper, tin bismuth, and tin lead.

The hole-filling resin may be a mixture of a powder containing one of silicon oxide, copper, silver, gold, nickel, platinum, palladium, ruthenium, tin, tin silver, tin silver copper, tin copper, tin bismuth, and tin lead, and one of resin materials selected from an epoxy/phenol resin, polyimide resin, cycloolefin, and PBO resin.

The material for the insulating resin layer may contain one of an epoxy/phenol resin, polyimide resin, cycloolefin, PBO resin, and silicon oxide.

Another aspect of the present invention is a semiconductor device including the wiring circuit substrate and the semiconductor element laminated to the wiring circuit substrate.

Another aspect of the present invention is a method of producing a wiring circuit substrate. The method includes a through-hole forming step of forming a through hole in a glass base; an inorganic adhesive layer forming step of forming a first inorganic adhesive layer containing an inorganic material on each surface of the glass base and the inner surface of the through-hole; a through electrode forming step of forming a first conductive layer containing a conductive material on each of the first inorganic adhesive layers, and forming a through electrode by filling the through-hole with a hole-filling resin; a surplus layer removing step of removing the first inorganic adhesive layers laminated to the surfaces of the glass base and the first conductive layer, while leaving the through electrode; a step of polishing the surfaces of the glass base; a step of forming second inorganic adhesive layers on the glass base and the through electrode, and forming on each of the second inorganic adhesive layers a second conductive layer to cover the upper and lower ends of the through electrode and forming first wire groups; an insulating resin layer forming step of forming insulating resin layers covering the first wire groups; a via hole forming step of forming via holes in the insulating resin layers on wires of the first wire groups; a wire group and conductive via forming step of forming second wire groups and conductive vias on the insulating resin layers with conductive materials; and a step of forming a predetermined number of layers of the insulating resin layers and the wire groups.

Another aspect of the present invention is a method of producing a wiring circuit substrate. The method includes a through-hole forming step of forming a through hole in a glass base; an inorganic adhesive layer forming step of forming a first inorganic adhesive layer containing an inorganic material on each surface of the glass base and the inner surface of the through-hole; a through electrode forming step of forming a first conductive layer containing a conductive material on each of the first inorganic adhesive layers, and forming a through electrode by filling the inside of the through-hole with a hole-filling resin; a surplus layer removing step of removing the first inorganic adhesive layers laminated to the surfaces of the glass base and the first conductive layer, while leaving the through electrode; a step of polishing the surfaces of the glass base; a step of forming second inorganic adhesive layers on the glass base and the through electrode, and forming on each of the second inorganic adhesive layers a second conductive layer to cover the upper and lower ends of the through electrode and forming first wire groups; an insulating resin layer forming step of forming insulating resin layers covering the first wire groups; a via hole forming step of forming via holes in the insulating resin layers on wires of the first wire group; a wire group and conductive via forming step of forming second wire groups and conductive vias on the insulating resin layers with conductive materials; and a step of forming a predetermined number of layers of the insulating resin layers and the wire groups.

Another aspect of the present invention is a method of producing a semiconductor device. The method includes a conductive pad forming step of forming a conductive pad on a wiring circuit substrate produced with any one of the methods of producing a wiring circuit substrate; and a semiconductor element fixing step of fixing a semiconductor element to the conductive pad.

Advantageous Effects of the Invention

The present invention provides a higher- or high-density wiring circuit substrate that, with both surfaces of a glass substrate smoothened, has fine wires formed on both surfaces of the glass, and that lessens or even avoids the local concentration of stress on the fine wires to provide sufficient reliability, a semiconductor device having the wiring circuit substrate, a method of producing the wiring circuit substrate, and a method of producing the semiconductor device.

BRIEF DESCRIPTION OF THE DRAWINGS

FIG. 3A is a cross-sectional diagram showing a method of producing a wiring circuit substrate, according to one embodiment of the present invention.

FIG. 3B is a cross-sectional diagram showing the method of producing a wiring circuit substrate of one embodiment of the present invention.

FIG. 3C is a cross-sectional diagram showing the method of producing a wiring circuit substrate, according to one embodiment of the present invention.

FIG. 3D is a cross-sectional diagram showing the method of producing a wiring circuit substrate, according to one embodiment of the present invention.

FIG. 3E is a cross-sectional diagram showing the method of producing a wiring circuit substrate, according to one embodiment of the present invention.

FIG. 3F is a cross-sectional diagram showing the method of producing a wiring circuit substrate, according to one embodiment of the present invention.

FIG. 3G is a cross-sectional diagram showing the method of producing a wiring circuit substrate, according to one embodiment of the present invention.

FIG. 3H is a cross-sectional diagram showing the method of producing a wiring circuit substrate, according to one embodiment of the present invention.

FIG. 4A is a cross-sectional diagram showing a method of producing a wiring circuit substrate, according to one embodiment of the present invention.

FIG. 4B is a cross-sectional diagram showing the method of producing a wiring circuit substrate, according to one embodiment of the present invention.

FIG. 4C is a cross-sectional diagram showing the method of producing a wiring circuit substrate, according to one embodiment of the present invention.

FIG. 4D is a cross-sectional diagram showing the method of producing a wiring circuit substrate, according to one embodiment of the present invention.

FIG. 4E is a cross-sectional diagram showing the method of producing a wiring circuit substrate, according to one embodiment of the present invention.

FIG. 4F is a cross-sectional diagram showing the method of producing a wiring circuit substrate, according to one embodiment of the present invention.

FIG. 4G is a cross-sectional diagram showing the method of producing a wiring circuit substrate, according to one embodiment of the present invention.

FIG. 4H is a cross-sectional diagram showing the method of producing a wiring circuit substrate, according to one embodiment of the present invention.

FIG. 5A is a cross-sectional diagram showing a method of producing a wiring circuit substrate, according to a comparative example.

FIG. 5B is a cross-sectional diagram showing the method of producing a wiring circuit substrate, according to the comparative example.

FIG. 5C is a cross-sectional diagram showing the method of producing a wiring circuit substrate, according to the comparative example.

FIG. 5D is a cross-sectional diagram showing the method of producing a wiring circuit substrate, according to the comparative example.

FIG. 5E is a cross-sectional diagram showing the method of producing a wiring circuit substrate, according to the comparative example.

FIG. 5F is a cross-sectional diagram showing the method of producing a wiring circuit substrate, according to the comparative example.

FIG. 5G is a cross-sectional diagram showing the method of producing a wiring circuit substrate, according to the comparative example.

FIG. 6 is a cross-sectional diagram of a conventional wiring circuit substrate.

DESCRIPTION OF THE EMBODIMENTS

A wiring circuit substrate 100 and a semiconductor device 200 according to one embodiment of the present invention will now be described with reference to the accompanying drawings.

(Configuration of a Wiring Circuit Substrate)

Figure 1:
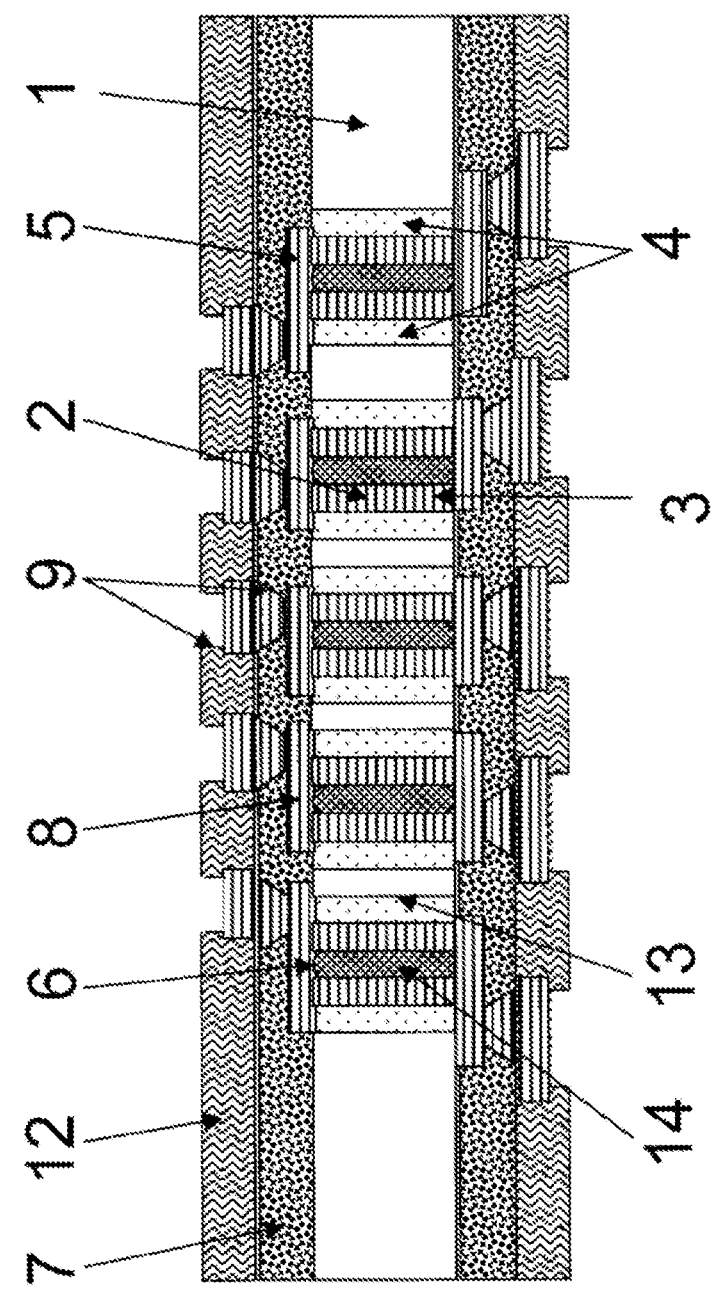
FIG. 1 is a cross-sectional diagram showing a wiring circuit substrate, according to one embodiment of the present invention.

FIG. 1 is a cross-sectional diagram of a wiring circuit substrate according to one embodiment of the present invention. As shown in FIG. 1, the wiring circuit substrate (glass interposer) 100 includes a glass base 1, a through electrode 3, a first inorganic adhesive layer 4, second conductive layers 5, lands 6, insulating resin layers 7, wire groups 8, conductive vias 9, and a hole-filling resin 14.

Specifically, the wiring circuit substrate 100 includes the glass base 1 having the through-hole 13, the insulating resin layers 7 laminated to the glass base 1 and having the conductive vias 9 formed therein, the wire groups 8 laminated to the insulating resin layers 7, the first inorganic adhesive layer 4 laminated to the inner surface of the through-hole 13, the through electrode 3 formed of the first conductive layer 2 laminated to the first inorganic adhesive layer 4, and the second conductive layers 5 are formed on the through electrode 3 and the glass base 1, and electrically connected to the upper and lower ends of the through electrode 3. The glass base has a surface roughness Ra of 100 nm or less, and the second conductive layers 5 each have an amount of dishing of 5 μm or less over the through electrode 3.

The inside of the first conductive layer 2 may be filled with the hole-filling resin 14, and the upper and lower ends of the through electrode 3 may be covered with the second conductive layers 5.

The inside of the first inorganic adhesive layer 4 may be filled with the first conductive layer 2.

The second inorganic adhesive layers may be formed on the glass base 1 and the through electrode 3, and the second conductive layers 5 may be formed on the second inorganic adhesive layers and may form wire groups.

The wire groups 8 may be covered with the insulating resin layers 7 having a thermal expansion coefficient greater than that of the material of the second conductive layers 5.

The first inorganic adhesive layer 4 or the second inorganic adhesive layer may be a single-layer or laminated film containing one of tin oxide, indium oxide, zinc oxide, nickel, nickel phosphorus, chromium, chromium oxide, aluminum nitride, copper nitride, aluminum oxide, tantalum, titanium, and copper.

The conductive material forming the first or second conductive layer 2 or 5 and the through electrode 3 may contain one of copper, silver, gold, nickel, platinum, palladium, ruthenium, tin, tin silver, tin silver copper, tin copper, tin bismuth, and tin lead.

The hole-filling resin 14 may be a mixture of a powder containing one of silicon oxide, copper, silver, gold, nickel, platinum, palladium, ruthenium, tin, tin silver, tin silver copper, tin copper, tin bismuth, and tin lead, and one of resin materials selected from an epoxy/phenol resin, polyimide resin, cycloolefin, and PBO resin.

The material for the insulating resin layer 7 may contain one of an epoxy/phenol resin, polyimide resin, cycloolefin, PBO resin, and silicon oxide.

The arrangement of the lands 6 of the upper and lower surfaces of the through electrode 3 formed of the first conductive layer 2, and the conductive vias 9 formed by lamination is not limited. A stacked via structure is possible where the through electrode 3 and the conductive vias 9 are formed overlapping each other by filling the inside of the through-hole 13 with the through electrode 3 and the hole-filling resin 14. The glass base 1 is a substrate made of glass (a glass substrate) containing SiO2 as the primary component, and has the through-hole 13.

The glass base 1 preferably has a thermal expansion coefficient of from 3 ppm/° C. to 4 ppm/° C. in the case of low expansion glass, and from 8 ppm/° C. to 9 ppm/° C. in the case of soda-lime glass; that is, the thermal expansion coefficient of the glass base 1 ranges from 3 ppm/° C. to 9 ppm/° C., depending on a production method or the addition of a metal component such as Na. The glass base has a Ra of 100 nm or less before the through-hole 13 is formed.

The thermal expansion coefficients mentioned above were measured according to JIS: R3102 and JIS: K7197 using TMA (thermomechanical analysis). The Ra (arithmetic mean roughness) of the glass base 1 mentioned above was measured with a stylus type film thickness gauge.

The through hole 13 in may be formed in the glass base 1 using, for example, a picosecond laser, femtosecond laser, excimer laser, electrical discharge machining, photosensitive glass, blasting, or the like, besides a $CO_2$ laser and UV laser, depending on the thickness of the glass base 13 and the diameter of the through hole 13.

Further, the through-hole 13 may be formed by processing from a surface on one side of the glass base 1, or a method of forming the through-hole 13 by processing from surfaces on both sides thereof.

The first inorganic adhesive layer 4 may be formed from a material having high adhesion between the glass base 1 and the conductive material, such as tin oxide, indium oxide, zinc oxide, nickel (having a thermal expansion coefficient of 15 ppm/° C.), nickel phosphorus, chromium (having a thermal expansion coefficient of 8 ppm/° C.), chromium oxide, aluminum nitride, copper nitride, aluminum oxide, tantalum (having a thermal expansion coefficient of 6 ppm/° C.), titanium (having a thermal expansion coefficient of 9 ppm/° C.), and copper (having a thermal expansion coefficient of 16 ppm/° C.).

The first inorganic adhesive layer 4 may be a single layer formed from one of the above-mentioned materials, or from a composite material containing two or more of the above-mentioned materials, such as an ITO film (having a thermal expansion coefficient of 9 ppm/° C.). Further, the first inorganic adhesive layer 4 may be formed in a laminated film of two or more layers of a composite material containing two or more of the above-mentioned materials, such as a laminated film of two layers respectively containing chromium/copper and titanium/copper.

The first inorganic adhesive layer 4 increases the adhesion of the glass base 1 to the through electrode 3 and the first conductive layer 2. In addition, since the thermal expansion coefficient of the first inorganic adhesive layer 4 is greater than that of the glass base 1, stress exerted between layers due to the difference in linear expansion coefficients of the through electrode 3 and first conductive layer 2 from the glass base 1 is low.

As long as the first inorganic adhesive layer 4 has a thickness within the range of 0.1 μm or more to 1 μm or less, the difference with the glass base 1 in adhesion and in thermal expansion coefficient is small.

The first inorganic adhesive layer 4 can be formed using, but not limited to, sputter deposition, electroless plating, or the like.

The through electrode 3 is formed of a conductive material, and is formed in the through-hole 13. The through electrode 13 may be formed by filling the inside of the first conductive layer 2 with the hole-filling resin 14, or may be formed by filling the inside of the first inorganic adhesive layer 4 with the first conductive layer 2.

Examples of the conductive material that can be selected for the through electrode 3 include an elemental metal of one of copper, silver, gold, nickel, platinum, palladium, ruthenium, tin, tin silver, tin silver copper, tin copper, tin bismuth, tin lead, or a lamination or a compound of one of the elemental metals, and a material having high adhesion to the first inorganic adhesive layer 4 and a material having high electrical connection stability.

The first conductive layer 2 of the through electrode 3 may be formed by electroless plating or electrolytic plating with conformal plating configuration or filled plating configuration.

After the first inorganic adhesive layer is formed, the through electrode may be formed by filling the inside of the first conductive layer 2 with a conductive hole-filling resin 14, which is a mixture of at least one metal powder selected from the materials mentioned above and a resin material.

As the density of semiconductor devices increases, wires and through electrodes 3 become finer, resulting in the through electrodes 3 having high aspect ratios and producing regions where filled plating configuration is impossible. In a region of high-aspect ratio, the through electrode 3 is formed in a conformal plating configuration. In a region of low aspect ratios, or in the case of a configuration with a large opening in the upper and lower surfaces of the through-hole 13, and the like, the through electrode 3 may be formed in a filled plating configuration.

In a conformal plating configuration formed by plating, a through-hole-shaped hole remains at the center of the through-hole 13. This through-hole-shaped hole at the center may be filled with a hole-filling resin 14 by screen printing or with a dispenser.

The hole-filling resin 14 preferably has a small a thermal expansion coefficient. In the temperature range of 260° C. or less, it is preferably 150 ppm/° C. or less, particularly preferably 100 ppm/° C. or less.

In a first CMP, surfaces of the glass base 1 is exposed by polishing and removing with CMP first conductive layers 2 on the surfaces of the glass base 1 and the hole-filling resins 14 present on the glass surfaces. As a polishing solution of CMP, a chemical solution having selective polishing properties capable of polishing the first conductive layers 2 and the hole-filling resins 14 but having low polishing properties capable of polishing a few tens of nm or less of the glass surfaces of a first conductive layer 2 and a hole-filling resin 14.

The polishing solution having selective polishing property is a mixture of a chemical solution suitable for the first conductive layer 2 and a chemical solution suitable for the hole-filling resin 14. For example, the chemical solution suitable for the first conductive layer 2 contains alumina, silicon oxide, cerium oxide, organic acids for additive ingredients, hydrogen peroxide or organic alkali, and the chemical solution suitable for the hole-filling resin 14 contains silicon oxide, cerium oxide, and alumina. After the first CMP, Ra of the glass surfaces was 300 nm, and the amount of dishing (amount of recess) was 10 μm.

As a polishing solution in a second CMP, a solution containing cerium oxide which is effective for polishing and smoothing a glass substrate was used to smooth depressions 24 on the glass surfaces formed in the first CMP, and the dross 22 and nodules 23 made from glass melted and adhered thereto due to laser beam machining. The smoothness of the glass surfaces was 100 nm or less, and the amount of dishing (amount of recess) was 5 μm or less.

Alternatively, the polishing solution for the second CMP may be a chemical solution of a composition containing colloidal silica and alumina so as to suppress the polishing properties capable of polishing a conductive layer and a hole-filling resin 14.

For the measurement of Ra (arithmetic mean roughness) and ruggedness of a surface, a stylus type film thickness gauge and an optical microscope capable of measuring focal depth were used.

Then, the second conductive layer 5 is laminated to each of the top and bottom of the through electrode 3 to cover the upper and lower ends of the through electrode 3 with the second conductive layers 5 and to thus connect the first conductive layer 2 inside the through electrode 3 to the hole-filling resin 14. This forms a core substrate 10 having the through electrode 3 capable of electrical connection at the front and back surfaces of the glass base 1. By laminating the wire group 8 and the insulating resin layer 7 to both surfaces of the core substrate 10, the wiring circuit substrate 100 is formed.

In the filled plating configuration, the first conductive layer 2 has a large thickness. Thus, to form fine wires, the first conductive layers 2 are polished and removed with a first CMP to the surface of the glass base 1 to expose the upper and lower ends of the through electrode 3, the surfaces of the glass base 1 are smoothed with a second CMP to reduce dishing 23 of the through electrode 3. Then, the second inorganic adhesive layers and the second conductive layers 5 are laminated to the glass base 1, and wire groups 8 are formed.

The second conductive layers 5 are formed with a conductive material, and are disposed on both surfaces of the glass base 1 with an inorganic adhesive layer therebetween.

A conductive material forming the second conductive layer 5 may be an elemental metal of one of copper, silver, gold, nickel, platinum, palladium, ruthenium, tin, tin silver, tin silver copper, tin copper, tin bismuth, and tin lead, or a lamination or compound of one of the elemental metals. In addition, a material having high adhesion to an inorganic adhesive layer 4 and having high electrical connection stability is selected as the conductive material.

As a conductive material forming the second conductive layer 5, electroless plating, electrolytic plating, and sputter deposition may be used, but it is possible, for example, to use a conductive paste which is a mixture of at least one metal powder selected from the materials mentioned above, and a resin material. A method of forming the second conductive layer 5 is not limited.

A method of forming the wire group 8 is not limited, but it is possible to form the wire group 8 by forming the second conductive layer 5 after the second CMP and forming a pattern where a portion to be a wiring circuit is covered with a photosensitive resist, and removing by etching the non-covered portion.

Alternatively, it is possible to form the wire group 8 by forming the second inorganic adhesive layer after the second CMP and forming a pattern where a portion to be a wiring circuit is open with a photosensitive resist, and after forming the second conductive layer 5 in the open portion, removing the photosensitive resist and the second inorganic adhesive layer.

The land 6 is formed in the second conductive layer 5. The land 6 may be formed with the same diameter as that of the through electrode 3, and formed on wires routed from the upper and lower ends or the through electrode 3.

The insulating resin layer 7 is formed on the wire group 8 formed of the second conductive layer 5.

The number of layers shown in FIG. 1 is not limiting, and the circuit substrate 100 is formed by laminating the required number of layers of the insulating resin layer 7, the conductive via 9, and the wire group 8. The required number of layers depends on, for example, the design of a product. A non-limiting method of forming the wire group 8 includes thickening a seed layer, which is an electroless plating or a sputter film, with an electrolytic film, and forming a pattern with a semi-additive process or a subtractive process.

The material for the insulating resin layer 7 may be a composite material containing at least two materials of one of an epoxy/phenol resin, polyimide resin, cycloolefin, and PBO resin, and an inorganic filler such as silicon oxide, and the like.

For example, the material for the insulating resin layer 7 may have a thermal expansion coefficient from 30 ppm/° C. to 100 ppm/° C., which is greater than that of the conductive material and has high elastic modulus. In that case, by covering the wire group 8 with the insulating resin layer 7 to reduce stress exerted between layers of the wire group 8 and the glass base 1, which prevents delamination of the wire group 8.

The material for the insulating resin layer 7 may be a dry film or liquid resist, but it is not limiting.

The wire group 8 is formed on the second inorganic adhesive layer.

The conductive via 9 is formed in the insulating resin layer 7, and electrically connects the second conductive layer 5 to the wire group 8.

The conductive via 9 is formed by filling the inside of a via hole formed in the insulating resin layer 7 with a conductive material such as a conformal plating, filled plating, conductive paste.

A method of forming the via hole 9 in the insulating resin layer 7 is selected depending on, for example, the material of the insulating resin layer 7. When the material of the insulating resin layer 7 is a thermosetting resin, machining with a $CO_2$ laser, UV laser, or the like can be used to form the via hole 9, and after the laser beam machining, a desmear process is performed to remove smearing developed due to the laser beam machining. In the case where the material of the insulating resin layer 7 is a photosensitive resist, the via hole 9 is formed by photolithography.

As describe above, the wiring circuit substrate 100 is a circuit substrate having a through electrode and having a multi-layer structure. In the wiring circuit substrate 100, the diameter and pitch of the through electrode 3 and the wires on the surfaces of the glass base 1 are miniaturized. Further, between the wire groups 8 formed on both surfaces of the glass base 1, high integration and highly reliable electrical connection in the through electrode 3 are achieved.

(Configuration of Semiconductor Device)

Figure 2:
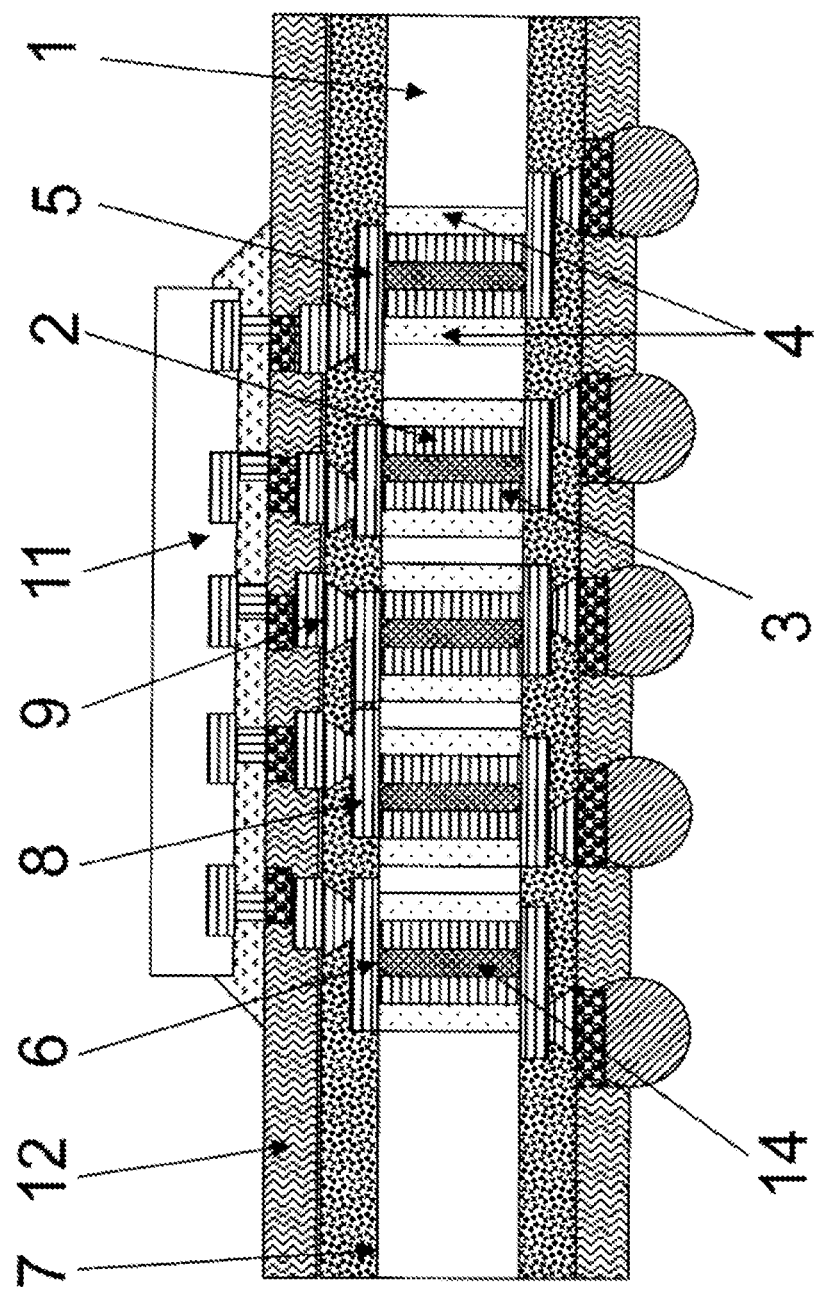
FIG. 2 is a cross-sectional diagram showing a semiconductor device, according to one embodiment of the present invention.
Figure 7:
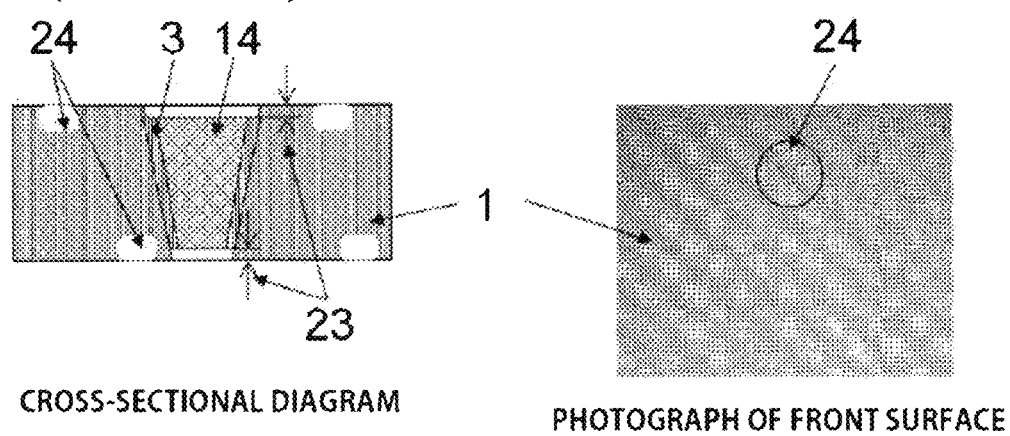
FIG. 7 is a cross-sectional diagram of a conventional wiring circuit substrate.

FIG. 2 is a cross-sectional diagram of a semiconductor device 200 according to one embodiment of the present invention. As shown in FIG. 2, the semiconductor device 200 can be formed by connecting the semiconductor element 11 to the wiring circuit substrate 100.

As shown in FIG. 2, the semiconductor device 200 includes the wiring circuit substrate 100 and the semiconductor element 11.

The wiring circuit substrate 100 is mounted to a print substrate (not shown), using solder balls or conductive bumps.

The semiconductor element 11 is disposed on one surface (the upper surface in FIG. 2) of the wiring circuit substrate 100 using solder balls and conduction bumps, which are not shown.

Further, the shape of the semiconductor element 11 shown in FIG. 2 and the method of connecting the semiconductor element 11 to the wiring circuit substrate 100 are exemplary and are not intended to be limiting.

Thus, the semiconductor device 200 provides multi-pin connection points between the semiconductor element 11 and the wiring circuit substrate 100, to which the semiconductor device 200 is connected, allowing the semiconductor device 200 to be smaller.

Further, as a result of increasing the smoothness of the surfaces of the glass base 1 of the wiring circuit substrate 100 to reduce the unevenness and ruggedness of the surfaces of the glass base 1, the wire groups 8 formed of the second conductive layers 5 have a more uniform width and film thickness, to avoid delamination and breakage in a reliability test involving high/low temperature changes, resulting in high connection reliability.

(Method of Producing a Wiring Circuit Substrate)

A method of producing the wiring circuit substrate 100 according to the embodiment of the present invention will now be described with reference to FIGS. 3A to 3H and FIGS. 4A to 5H. FIGS. 3A to 3H are cross-sectional diagrams showing methods of producing a wiring circuit substrate according to the first embodiment, while FIGS. 4A to 4H are cross-sectional diagrams showing methods of producing a wiring circuit substrate according to the second embodiment.

A method of producing a wiring circuit substrate according to the first embodiment includes a through-hole forming step of forming a through hole 13 in a glass base 1 (FIG. 3A); an inorganic adhesive layer forming step of forming a first inorganic adhesive layer 4 containing an inorganic material on both surfaces of the glass base 1 and the inner surface of the through-hole 13 (FIG. 3B); a through electrode forming step of forming a first conductive layer 2 formed of a conductive material on each of the first inorganic adhesive layers 4, and forming a through electrode 3 by filling the through-hole with a hole-filling resin 14 (FIG. 3C); a surplus layer removing step of removing the first inorganic adhesive layers 4 and the first conductive layers 2 laminated to the surfaces of the glass base 1, while leaving the through electrode 3 (FIG. 3D); a step of polishing the surfaces of the glass base 1 (FIG. 3E); a step of forming second inorganic adhesive layers on the glass base 1 and the through electrode 3, and forming on each of the second inorganic adhesive layers a second conductive layer 5 to cover the upper and lower ends of the through electrode 3 and forming first wire groups 8 (FIG. 3F); an insulating resin layer forming step of forming insulating resin layers 7 covering the first wire groups 8; a via hole forming step of forming via holes 9 in the insulating resin layers 7 on wires of the first wire group 8 (FIG. 3G); a wire group and conductive via forming step of forming second wire groups 8 and conductive vias 9 with a conductive material on the insulating resin layers 7; and a step of forming a predetermined number of layers of the insulating resin layers 7 and the wire groups 8 (FIG. 3H).

A method of producing a wiring circuit substrate according to the second embodiment includes a through-hole forming step of forming a through hole 13 in a glass base 1 (FIG. 4A); an inorganic adhesive layer forming step of forming a first inorganic adhesive layer 4 containing an inorganic material on both surfaces of the glass base 1 and the inner surface of the through-hole (FIG. 4B); a through electrode forming step of forming a first conductive layer 2 containing a conductive material on each of the first inorganic adhesive layers 4, and forming a through electrode 3 by filling the inside of the through-hole 13 with a conductive material (FIG. 4C); a surplus layer removing step of removing the first inorganic adhesive layers 4 and the first conductive layers 2 laminated to the surfaces of the glass base 1, while leaving the through electrode 3 (FIG. 4D); a step of polishing the surfaces of the glass base 1 (FIG. 4E); a step of forming second inorganic adhesive layers on the glass base 1 and the through electrode 3, and forming on each of the second inorganic adhesive layers a second conductive layer 5 to cover the upper and lower ends of the through electrode 3 and forming first wire groups 8 (FIG. 4F); an insulating resin layer forming step of forming insulating resin layers 7 covering the first wire groups 8; a via hole forming step of forming via holes 9 in the insulating resin layers 7 on wires of the first wire groups 8 (FIG. 4G); a wire group and conductive via forming step of forming second wire groups 8 and conductive vias 9 with a conductive material on the insulating resin layers 7; and a step of forming a predetermined number of layers of the insulating resin layers 7 and the wire groups 8 (FIG. 4H).

EXAMPLES

The Examples of the present invention will be described, together with a method of producing the wiring circuit substrate, and a method of producing the semiconductor device.

Example 1

Example 1 will now be described with reference to FIG. 1, FIG. 2, and FIG. 3A to FIG. 3H.

As the glass base 1, a low-expansion glass with a thickness of 0.3 mm and a size of 200 mm×200 mm (Ra: 100 nm, CTE: 4 ppm/° C.) was used.

First, a through-hole 13 was formed in a glass base 1 with a $4^{th}$ harmonic UV-YAG laser. The through-hole 13 was formed to have a diameter of 60 µmΦ at the top and 40 µmΦ at the bottom (FIG. 3A)

Then, a Ti film having a thickness of 0.05 µm and a Cu film having a thickness of 0.2 µm were laminated to form a first inorganic adhesive layer 4 on the surface of the glass base 1 and on the inside of the through-hole 13 by sputter deposition (FIG. 3B).

Then, a first conductive layer 2 having a thickness of 6 µm was formed on the surfaces of the glass base 1 and on the inside of the through-hole 13 by electrolytic copper plating. Further, the inside of the through-hole 13 was formed in a conformal copper plating configuration.

The inside of the through-hole 13 having the conformal copper plating applied thereto was filled by screen printing with the hole-filling resin 14 containing a mixture material of silicon oxide and an epoxy-based organic resin (FIG. 3C).

Then, the first conductive layers 2 on the surfaces of the glass base 1, and the hole-filling resins 14 exposed at the surface were polished and removed in a first CMP using a polishing solution containing a mixture of silicon oxide, alumina, and hydrogen peroxide until the surface of the glass base 1 was exposed. As a result, the dross 21 was produced on the surface of the glass base 1, and the dishing 23 formed in the first conductive layer 2 and the hole-filling resin 14 (FIG. 3D).

Then, the surfaces of the glass base 1 were polished in a second CMP using a polishing solution containing cerium oxide as the primary component so as to be smoothed (FIG. 3E).

Then, a second inorganic adhesive layer (not shown) and a second conductive layer 5 were formed on both surfaces of the glass base 1, and the wire groups 8 were formed to produce a core base material 10.

The wire group 8 having an LS value of 4 µm was formed by forming, as the second inorganic adhesive layer, a lamination of a Ti film having a thickness of 0.05 µm and a Cu film having a thickness of 0.2 µm using sputter deposition, and an electrolytic copper plating having a thickness of 4 µm was formed with a semi-additive process using the second inorganic adhesive layer as a seed layer (FIG. 3F).

Then, the insulating resin layer 7 was laminated to both surfaces of the core substrate 10, and the conductive via 9 was formed in the insulating resin layers 7. The material for the insulating resin layer 7 was ABF formed from an epoxy resin.

The conductive via 9 was formed by conformal plating. A UV-YAG laser was used to form the conductive via 9 in the insulating resin layer 7, with the inner diameter thereof being 20 µmΦ (FIGS. 3G and 3H).

Then, the required number of layers of the wire group 8, the new insulating resin layer 7, and the conductive via 9 were further laminated to the insulating resin layer 7, a photosensitive solder resist 12 was formed on the outermost insulating resin layer, a conductive pad portion was formed by electroless Ni/Pt/Au plating, to form a circuit substrate 100.

A method of producing a wiring circuit substrate 100 of Example 1 included a through hole forming step; an inorganic adhesive layer forming step; a conductive layer and through electrode forming step; a land forming step; an insulating resin layer forming step; a via hole forming step; and a wire group and conductive via forming step.

At the through hole forming step, as shown in FIG. 3A, a through-hole 13 was formed in the glass base 1 with a UV-YAG laser.

At the inorganic adhesive layer forming step, as shown in FIG. 3B, a first inorganic adhesive layer 4 was formed by consecutively forming a sputtered Ti film and a sputtered Cu film on both surfaces of the glass base 1 and the inside of the through-hole 13.

At the conductive layer and through electrode forming step, as shown in FIG. 3C, a first conductive layer 2 formed of an electrolytic copper plating using a conductive material was formed on both surfaces of the glass base 1 and the inside of the through-hole 13, that is, on the first inorganic adhesive layers 4. The electrolytic copper plating was formed by conformal coating, and the inside of the conformal coating was filled with the hole-filling resin 14 by vacuum printing, followed by curing.

As shown in FIGS. 3D to 3F, at the land forming step as a first CMP, the electrolytic copper platings formed on both surfaces of the glass base 1, and the hole-filling resin 14 protruding from the through-hole 13 were polished by CMP until the first conductive layers 2 on both surfaces of the substrate 1 is removed while using the glass surfaces of the glass base 1 as a stopper layer.

As a second CMP, the surfaces of the glass substrate 1 were polished to be smoothed.

Then, as an inorganic adhesive layer allowing the upper and lower surfaces of the hole-filling resin 14 of the through-hole 13, a second inorganic adhesive layer (not shown) was formed on each surface of the core substrate 10, an open photosensitive resist pattern was formed by a semi-additive process, and an electrolytic copper plating was formed in a thickness of 4 µm on the surfaces of the core substrate 10. Further, as shown in FIG. 3F, the photosensitive resist was delaminated, and wet etching was performed on a Ti film and a Cu film of the second inorganic adhesive layers except for the lands 6 on the surfaces of the glass base 1.

At the insulating resin layer forming step and the via hole forming step, as shown in FIG. 3G, the insulating resin layer 7 was laminated to each surface of the core substrate 10, and a via hole was formed with a UV-YAG laser in the insulating resin layer 7 on the through electrode 3. The diameter of the via hole was set less than the diameter of the through electrode 3. Further, dust inside the via hole generated in the UV-YAG laser beam machining was cleaned by desmearing with an alkaline water solution based processing liquid.

At the wire group and conductive via forming step, an electroless copper plating was formed as a seed layer on the insulating resin layer 7. As shown in FIG. 3H, the wire group 8 and the conductive via 9 were formed on the seed layer by forming a resist pattern that has openings corresponding to the portions of the wire group 8 and the conductive via 9 by a negative resist, and, after forming an electrolytic copper plating in a thickness of 4 μm with the semi-additive process, removing the resist and unnecessary portion of the seed layer.

A method of producing the semiconductor device 200 of Example 1 included a conductive pad forming step of forming a conductive pad on the wiring circuit substrate 100 produced with the method of producing a wiring circuit substrate mentioned above, and a semiconductor element fixing step of fixing the semiconductor element 11 to a conductive pad.

At the conductive pad forming step, a photosensitive solder resist 12 was laminated to the glass base 1, followed by exposure and development, and the conductive pad portion was formed by electroless Ni/Pt/Au plating.

At the semiconductor element fixing step, the semiconductor element 11 was fixed to the conductive pad by soldering.

Although in Example 1, the number of layers of the wire group 8 on one surface was 2, a covering layer for a surface was the solder resist 12, and a surface of the conductive pad was processed with electroless Ni/Pt/Au plating, these configurations are not limiting.

Example 2

Example 2 will now be described with reference to FIGS. 4A to 4H as well as FIGS. 1 and 2.

As the glass base 1, a low-expansion glass with a thickness of 0.3 mm and a size of 200 mm×200 mm (Ra: 100 nm, CTE: 4 ppm/° C.) was used.

First, a $4^{th}$ harmonic UV-YAG laser was used to form a through-hole 13 in a glass base 1. The through-hole 13 was formed to have an inner diameter of 100 μmΦ at the top and 80 μmΦ at the bottom (FIG. 4A).

Then, a Ni—Cr alloy film having a thickness of 0.05 μm and a Cu film having a thickness of 0.2 μm were laminated to form a first inorganic adhesive layer 4 on the surfaces of the glass base 1 and on the inside of the through-hole 13 by sputter deposition (FIG. 4B).

Then, the first conductive layer 2 was formed on the surfaces of the glass base 1 and on the inside of the through-hole 13 by electrolytic copper plating in a filled plating configuration. The first conductive layer 2 had a thickness of 15 μm (FIG. 4C).

Then, the first conductive layer 2 on the surfaces of the glass base 1 were polished and removed in a first CMP using a polishing solution containing a mixture of silicon oxide, alumina, and organic acid until the surfaces of the glass base 1 were exposed. As a result, dross 21 was produced on the surfaces of the glass base 1, and dishing 23 formed in the first conductive layer 2 (FIG. 4D).

Then, the surfaces of the glass base 1 were polished in a second CMP using a polishing solution containing cerium oxide as the primary component so as to be smoothed (FIG. 4E).

Then, a second inorganic adhesive layer (not shown) and a second conductive layer 5 were formed on both surfaces of the glass base 1, and wire groups 8 were formed to produce a core base material 10.

The wire group 8 having an LS value of 4 μm was formed by forming, as the second inorganic adhesive layer, a lamination of a Ni—Cr film having a thickness of 0.05 μm and a Cu film having a thickness of 0.2 μm using sputter deposition, and an electrolytic copper plating having a thickness of 4 μm was formed with a semi-additive process using the second inorganic adhesive layer as a seed layer (FIG. 4F)

Then, an insulating resin layer 7 was laminated to both surfaces of the core substrate 10, and a conductive via 9 was formed in the insulating resin layer 7. The material for the insulating resin layer 7 was ABK formed from an epoxy resin.

The conductive via 9 was formed by conformal coating. A UV-YAG laser was used to form the conductive via 9 in the insulating resin layer 7, with the inner diameter thereof being 20 μmΦ (FIGS. 4G and 4H).

Then, the required number of layers of the wire groups 8 and the new insulating resin layers 7 and the conductive vias 9 were further laminated to the insulating resin layers 7, a photosensitive solder resist 12 was laminated to each of the outermost insulating resin layers 7, a conductive pad portion was formed by non-electrolytic Ni/Au plating to form a circuit substrate 100 (FIG. 4H).

A method of producing a wiring circuit substrate 100 of Example 2 included a through hole forming step; an inorganic adhesive layer forming step; a conductive layer and through electrode forming step; a land forming step; an insulating resin layer forming step; a via hole forming step; and a wire group and conductive via forming step.

At the through hole forming step, as shown in FIG. 4A, the through-hole 13 was formed in the glass base 1 using a UV-YAG laser.

At the inorganic adhesive layer forming step, as shown in FIG. 4B, the first inorganic adhesive layer was formed by consecutively forming a sputtered Ni—Cr film and a sputtered Cu film on both surfaces of the glass base 1 and the inside of the through-hole 13.

At the conductive layer and through electrode forming step, as shown in FIG. 4C, the first conductive layer 2 formed of an electrolytic copper plating of conductive material is formed on both surfaces of the glass base 1 and the inside of the through-hole 13, that is, on the first inorganic adhesive layer 4. The electrolytic copper plating was formed in a filled plating configuration.

As shown in FIGS. 4D to 4F, at the land forming step as a first CMP, the electrolytic copper platings formed on both surfaces of the glass base 1 were polished until the conductive layers 5 on both surfaces of the glass base 1 were removed with CMP while using the glass surfaces of substrate 1 as a stopper layer.

As a second CMP, the surfaces of the glass substrate 1 were polished to be smoothed.

Then, as an inorganic adhesive layer on which the conductive layer 5 having electrical connection with the through-hole 13, a second inorganic adhesive layer (not shown) was formed on each surface of the core substrate 10, a photosensitive resist pattern was formed to have an opening corresponding to a pattern of the land 6 using the semi-additive process, and an electrolytic copper plating was formed in a thickness of 4 μm on each surface of the core substrate 10. Further, as shown in FIG. 4F, the photosensitive resist was delaminated, and wet etching was performed on a Ni—Cr film and a Cu film of the second inorganic adhesive layer except for the land 6 of the surface of the glass base 1.

At the insulating resin layer forming step and the via hole forming step, as shown in FIG. 4G, the insulating resin layer 7 was laminated to each surface of the core substrate 10, and a via hole was formed with a UV-YAG laser in the insulating resin layer 7 on the through electrode 3. The via hole was formed to have a diameter less than the diameter of the through electrode 3. Further, dust inside the via hole generated in the UV-YAG laser beam machining was cleaned by desmearing with an alkaline water solution based processing liquid.

At the wire group and conductive via forming step, an electroless copper plating was formed as a seed layer on the insulating resin layer 7. As shown in FIG. 4H, the wire group 8 and the conductive via 9 were formed on the seed layer by forming a resist pattern that has openings corresponding to the portions of the wire group 8 and the conductive via 9 by a negative resist, and after forming an electrolytic copper plating having a thickness of 4 µm with the semi-additive process, removing the resist and unnecessary portion of the seed layer.

A method of producing the semiconductor device 200 of Example 2 included a conductive pad forming step of forming a conductive pad on the wiring circuit substrate 100 produced with the method of producing a wiring circuit substrate mentioned above, and a semiconductor element fixing step of fixing the semiconductor element 11 to a conductive pad.

At the conductive pad forming step, a photosensitive solder resist 12 was laminated to the wiring circuit substrate 100, followed by exposure and development, and the conductive pad portion was formed by electroless Ni/Pt/Au plating.

At the semiconductor element fixing step, the semiconductor element 11 was fix to the conductive pad by soldering.

Although in Example 2, two layers of the wire groups 8 were formed on one surface, a covering layer for a surface was the solder resist 12, and a surface of the conductive pad was processed with electroless Ni/Pt/Au plating, these configurations are not limiting.

Assessment of Examples 1 and 2

Using the production methods according to Examples 1 and 2, the smoothness Ra of the glass surface after the second CMP is less than or equal to 100 nm, and the heights of the dross 21 and the nodule 22 on the glass surface are less than or equal to 5 µm.

With the amount of dishing 23 in the through electrode 3 inside the through-hole 13 after the second CMP being 5 µm or less, the amount of dishing formed in the conductive layer 5 above the through electrode 3 will be at most 5 µm. These results demonstrate that it is possible to produce the wiring circuit substrate 100 having a fine wire group with an L/S of 5 µm or less on the surface of the glass base 1.

The results also demonstrate that in the semiconductor device 200 formed using the wiring circuit substrate 100, it is possible to improve uniformity in wire width and film thickness of the conductive layer 5, to avoid delamination and breakage in reliability tests involving high/low temperature changes and to achieve high connection reliability.

The smoothness Ra (arithmetic mean roughness) of the glass base was measured with a stylus type film thickness gauge.

The reliability test was assessed by the presence or absence of disconnections using thermal shock testing (TST) stated in JESD22-A106B by JEDEC, C: 125° C.--55° C., 400 cycles.

Data for Examples 1 and 2, and Comparative Example 1 described later are summarized in Table 1.

TABLE 1

|  | Dross Height (Glass surface) | Amount of Dishing (Conductive layer 5) | Ra (Glass Surface) | Wire Width (Glass surface) | Disconnection After TST |
|---|---|---|---|---|---|
| Example 1 | 3 µm | 4 µm | 100 µm | L/S4 ± 0.5 µm | + |
| Example 2 | 3 µm | 5 µm | 100 µm | L/S4 ± 0.5 µm | + |
| Comparative Example | 10 µm | 6 µm | 300 µm | L/S4 ± 2 µm | − |

Regarding signs showing breakage or no breakage after TST, "+" denotes a survival rate (a ratio of the wiring circuit substrate 100 not developing breakage) of 60% or more and less than 80%, and "−" denotes a survival rate of 20% or more and less than 60%.

Signs "+" for Examples 1 and 2 are due to breakage inside the through electrode 3, and are not affected by breakage of the conductive layer 5 on the surface of the glass substrate. Sign "−" for Comparative example was due to breakage of the conductive layer 5 in the vicinity of the glass surface of the through electrode 3 and on the surface on the glass substrate and breakage of the conductive layer 5 at the point of origin of the glass edge portion of the through-hole 3 due to the dishing 23.

The second CMP reduces the amount of dishing in the through electrode 3, and allows an initial rise of the glass edge of the through electrode to have a smooth curve, thus reducing stress concentration to the conductive layer 5.

This assessment shows that reliability of wires improved about twice as much compared to that of Comparative Example by increasing the smoothness of the surfaces of the glass base 1.

Comparative Example

The Comparative Example will be described with reference to FIGS. 5a to 5G as well as FIGS. 1 and 2, FIGS. 3A to 3H, and FIGS. 4A to 4H. FIGS. 5a to 5G show a method of producing the wiring circuit substrate 100 of the Comparative example.

The glass base 1 was a low-expansion glass with a thickness of 0.3 mm and a size of 200 mm×200 mm (Ra: 100 nm, CTE: 4 ppm/° C.).

First, as shown in FIG. 5A, a 4$^{th}$ harmonic UV-YAG laser was used to form the through-hole 13 in the glass base 1. The through-hole 13 was formed to have an inner diameter of 60 µmΦ at the top and 40 µmΦ at the bottom.

Then, as shown in FIG. 5B, a Ti film with a thickness of 0.05 µm and a Cu film with a thickness of 0.2 µm were laminated to form the first inorganic adhesive layer 4 on the surface of the glass base 1 and on the inside of the through-hole 13 by sputter deposition.

Then, as shown in FIG. 5C, the first conductive layer 2 was formed in a thickness of 6 µm on the surface of the glass base 1 and on the inside of the through-hole 13 by electrolytic copper plating. The inside of the through-hole 13 was formed in a conformal copper plating configuration.

The inside of the through-hole 13 having the conformal copper plating applied thereto was filled by screen printing with the hole-filling resin 14 containing a mixture material of silicon oxide and an epoxy-based organic resin.

Then, as shown in FIG. 5D, the first conductive layer 2 on the surface of the glass base 1, and the hole-filling resin 14 exposed at the surface were polished and removed in the first CMP until the surface of the glass base 1 was exposed. As a result, the dross 21 was produced on the surface of the glass base 1, and the dishing 23 formed in the hole-filling resin 14.

Then, as shown in FIG. 5E, the second inorganic adhesive layer (not shown) and the second conductive layer 5 were formed on both surfaces of the glass base 1, and the wire group 8 was formed to produce a core base material 10. The wire group 8 having an LS value of 4 μm was formed by laminating and forming a Ti film with thickness of 0.05 μm and a Cu film with a thickness of 0.2 μm by sputter deposition as the second inorganic adhesive layer, and an electrolytic copper plating in a thickness of 4 μm was formed with a semi-additive process using the second inorganic adhesive layer as a seed layer Then, as shown in FIGS. 5F and 5G, the insulating resin layer 7 was laminated to both surfaces of the core substrate 10, and the conductive via 9 was formed on the insulating resin layer 7. The material for the insulating resin layer 7 was ABK containing an epoxy resin.

The conductive via 9 was formed by conformal coating. A UV-YAG laser was used to form the conductive via 9 in the insulating resin layer 7, with its inner diameter being 20 μmΦ.

Then, as shown in FIG. 5G, the required number of layers of the wire groups 8 and the new insulating resin layers 7 and the conductive vias 9 were further laminated to the insulating resin layers 7, a photosensitive solder resist 12 was formed on each of the outermost insulating resin layers, a conductive pad portion was formed by electroless Ni/Pt/Au plating to form a circuit substrate.

Further, in the method of producing the semiconductor device according to the Comparative example, the semiconductor element 11 was fixed on the conductive pad by soldering in contrast to the wiring circuit substrate produced with the method of producing the wiring circuit substrate mentioned above.

Assessment of Comparative Example

Using the production method of the Comparative example, it is possible to form the conductive layer 5 on the surface of the glass base 1, to laminate the insulating resin layer 7, and to form the wire group 8 by lamination, to produce the wiring circuit substrate. However, it was confirmed that the variations in the wire width within the wiring circuit substrate were about four times as large as those of Examples 1 and 2, due to the ruggedness such as the dross 21 and the nodule 22 on the surface of the glass base 1 and the recess 23 in the glass surface.

Further, after the TST reliability test focused on the conductive layer 5, it was confirmed that conduction breakage was about twice as large as those of Examples 1 and 2 due to uneven wiring at the edge portion of a glass hole of the through-hole 13 and variations in wiring width and thickness developed at the rugged portion of the surface of the glass base 1.

As described above, it is confirmed that the present invention provides the wiring circuit substrate 100 and the semiconductor device 200 having sufficient reliability.

The present invention is not limited to specific combinations of features disclosed herein, and can be implemented by optionally selecting or omitting each of the features.

INDUSTRIAL APPLICABILITY

The present invention relates to a wiring circuit substrate and a semiconductor device. In particular, the present invention relates to a wiring circuit substrate interposed between a package substrate and a semiconductor element and to a semiconductor device having a wiring circuit substrate for connecting semiconductor elements.

REFERENCE SIGNS LIST

1 . . . Glass base
2 . . . First conductive layer
3 . . . Through electrode
4 . . . First inorganic adhesive layer
5 . . . Second conductive layer
6 . . . Land
7 . . . Insulating resin layer
8 . . . Wire group
9 . . . Conductive via or via hole
10 . . . Core substrate
11 . . . Semiconductor element
12 . . . Solder resist
13 . . . Through-hole
14 . . . Hole-filling resin
21 . . . Dross
22 . . . Nodule
23 . . . Dishing (recess)
24 . . . (Glass) Depression
100 . . . Wiring circuit substrate
200 . . . Semiconductor device

What is claimed is:

1. A wiring circuit substrate comprising:
a glass base having a through-hole;
insulating resin layers laminated to the glass base and each having a conductive via formed therein;
a wire group laminated to each of the insulating resin layers;
a first inorganic adhesive layer laminated to an inner surface of the through-hole;
a through electrode formed of a first conductive layer laminated to the first inorganic adhesive layer; and
second conductive layers formed on the through electrode and the glass base, the second conductive layers being electrically connected to upper and lower ends of the through electrode,
wherein the glass base has a surface roughness Ra of 100 nm or less,
the second conductive layers each have an amount of dishing of 5 μm or less above the through electrode,
an inside of the first conductive layer is filled with a hole-filling resin, and the upper and lower ends of the through electrode are covered with the second conductive layers, and
the hole-filling resin is a mixture of a powder comprising one of silicon oxide, copper, silver, gold, nickel, platinum, palladium, ruthenium, tin, tin silver, tin silver copper, tin copper, tin bismuth, and tin lead, and one of resin materials selected from an epoxy/phenol resin, polyimide resin, cycloolefin, and PBO resin.

2. The wiring circuit substrate of claim 1, wherein an inside of the first inorganic adhesive layer is filled with the first conductive layer.

3. The wiring circuit substrate of claim 1, wherein second inorganic adhesive layers are formed on the glass base and the through electrode, and the second conductive layer are formed on the second inorganic adhesive layers and form wire groups.

4. The wiring circuit substrate of claim 1, wherein the wire groups are each covered with an insulating resin layer having a thermal expansion coefficient greater than that of a material of the second conductive layer.

5. The wiring circuit substrate of claim 1, wherein the first inorganic adhesive is a single-layer or laminated film comprising one of tin oxide, indium oxide, zinc oxide, nickel, nickel phosphorus, chromium, chromium oxide, aluminum nitride, copper nitride, aluminum oxide, tantalum, titanium, and copper.

6. The wiring circuit substrate of claim 1, wherein a conductive material forming the first or second conductive layers and the through electrode comprises one of copper, silver, gold, nickel, platinum, palladium, ruthenium, tin, tin silver, tin silver copper, tin copper, tin bismuth, and tin lead.

7. The wiring circuit substrate of claim 1, wherein the one of resin materials is selected from an epoxy/phenol resin, cycloolefin, and PBO resin.

8. The wiring circuit substrate of claim 1, wherein a material for the insulating resin layers comprises one of an epoxy/phenol resin, polyimide resin, cycloolefin, PBO resin, and silicon oxide.

9. A semiconductor device comprising the wiring circuit substrate of claim 1, and a semiconductor element laminated to the wiring circuit substrate.

10. A method of producing the wiring circuit substrate recited in claim 1, comprising:
   a through-hole forming step of forming a through hole in a glass base;
   an inorganic adhesive layer forming step of forming a first inorganic adhesive layer comprising an inorganic material on each surface of the glass base and an inner surface of the through-hole;
   a through electrode forming step of forming a first conductive layer comprising a conductive material on the first inorganic adhesive layer, and forming a through electrode by filling the through-hole with a hole-filling resin;
   a surplus layer removing step of removing the first inorganic adhesive layers laminated to the surfaces of the glass base and the first conductive layer, while leaving the through electrode;
   a step of polishing the surfaces of the glass base;
   a step of forming second inorganic adhesive layers on the glass base and the through electrode, and forming on each of the second inorganic adhesive layers a second conductive layer to cover upper and lower ends of the through electrode and forming first wire groups;
   an insulating resin layer forming step of forming insulating resin layers covering the first wire groups;
   a via hole forming step of forming via holes in the insulating resin layers on wires of the first wire groups;
   a wire group and conductive via forming step of forming second wire groups and conductive vias on the insulating resin layers with conductive materials; and
   a step of forming a predetermined number of layers of the insulating resin layers and the wire groups.

11. A method of producing the wiring circuit substrate recited in claim 1, comprising:
   a through-hole forming step of forming a through hole in a glass base;
   an inorganic adhesive layer forming step of forming a first inorganic adhesive layer comprising an inorganic material on each surface of the glass base and an inner surface of the through-hole;
   a through electrode forming step of forming a first conductive layer comprising a conductive material on the first inorganic adhesive layer, and forming a through electrode by filling an inside of the through-hole with a hole-filling resin;
   a surplus layer removing step of removing the first inorganic adhesive layers laminated to the surfaces of the glass base and the first conductive layer, while leaving the through electrode;
   a step of polishing the surfaces of the glass base;
   a step of forming second inorganic adhesive layers on the glass base and the through electrode, and forming on each of the second inorganic adhesive layers a second conductive layer to cover upper and lower ends of the through electrode and forming first wire groups;
   an insulating resin layer forming step of forming insulating resin layers covering the first wire groups;
   a via hole forming step of forming via holes in the insulating resin layers on wires of the first wire group;
   a wire group and conductive via forming step of forming second wire groups and conductive vias on the insulating resin layers with conductive materials; and
   a step of forming a predetermined number of layers of the insulating resin layers and the wire groups.

12. A method of producing a semiconductor device, comprising:
   a conductive pad forming step of forming a conductive pad on a wiring circuit substrate produced with the method of producing a wiring circuit substrate according to claim 10; and
   a semiconductor element fixing step of fixing a semiconductor element to the conductive pad.

13. A method of producing a semiconductor device, comprising:
   a conductive pad forming step of forming a conductive pad on a wiring circuit substrate produced with the method of producing a wiring circuit substrate according to claim 11; and
   a semiconductor element fixing step of fixing a semiconductor element to the conductive pad.

14. The wiring circuit substrate of claim 3, wherein the second inorganic adhesive layers are each a single-layer or laminated film comprising one of tin oxide, indium oxide, zinc oxide, nickel, nickel phosphorus, chromium, chromium oxide, aluminum nitride, copper nitride, aluminum oxide, tantalum, titanium, and copper.

* * * * *